US009692398B2

United States Patent
Chu

(10) Patent No.: US 9,692,398 B2
(45) Date of Patent: Jun. 27, 2017

(54) APPARATUSES AND METHODS FOR VOLTAGE BUFFERING

(71) Applicant: Micron Technology, Inc., Boise, ID (US)

(72) Inventor: Wei Lu Chu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 14/417,105

(22) PCT Filed: Aug. 25, 2014

(86) PCT No.: PCT/CN2014/085093
§ 371 (c)(1),
(2) Date: Jan. 23, 2015

(87) PCT Pub. No.: WO2016/029341
PCT Pub. Date: Mar. 3, 2016

(65) Prior Publication Data
US 2016/0218699 A1   Jul. 28, 2016

(51) Int. Cl.
*G11C 7/10* (2006.01)
*H03K 3/356* (2006.01)
*H03F 3/347* (2006.01)
*G11C 29/50* (2006.01)

(52) U.S. Cl.
CPC ........... *H03K 3/356* (2013.01); *G11C 7/1084* (2013.01); *G11C 29/50* (2013.01); *H03F 3/347* (2013.01); *G11C 2029/5004* (2013.01)

(58) Field of Classification Search
CPC .......................... G11C 13/004; G11C 13/0069
See application file for complete search history.

(56) References Cited

U.S. PATENT DOCUMENTS

| 5,933,027 A | 8/1999 | Morris et al. |
| 6,366,124 B1 * | 4/2002 | Kwong ................ H03K 17/063 326/81 |
| 2003/0231523 A1 | 12/2003 | Cho et al. |
| 2004/0150464 A1 | 8/2004 | Khalid |
| 2007/0096821 A1 | 5/2007 | Ryu et al. |

(Continued)

FOREIGN PATENT DOCUMENTS

| CN | 101390423 A | 3/2009 |
| CN | 202548685 U | 11/2012 |

(Continued)

OTHER PUBLICATIONS

International Search Report and Written Opinion dated Mar. 31, 2015 for PCT/CN2014/085093.

*Primary Examiner* — Richard Elms
*Assistant Examiner* — Mohammed A Bashar
(74) *Attorney, Agent, or Firm* — Dorsey & Whitney LLP

(57) ABSTRACT

An apparatuses and methods for buffering a voltage from a circuit without current drive ability are described. An example apparatus includes a voltage buffer that includes two identical stages. The first stage is configured to receive an input voltage and produce an intermediate voltage as an output. The second stage is configured to receive the intermediate voltage and provide an output voltage that is equal to the input voltage. The voltage buffer may be coupled to a current source. The second stage of the voltage buffer may have current drive ability.

13 Claims, 4 Drawing Sheets

(56) References Cited

U.S. PATENT DOCUMENTS

| | | | |
|---|---|---|---|
| 2009/0230997 A1* | 9/2009 | Kwon | H03K 19/00361 327/108 |
| 2011/0128773 A1* | 6/2011 | Azuma | G11C 13/0007 365/148 |

FOREIGN PATENT DOCUMENTS

| | | |
|---|---|---|
| CN | 103066991 A | 4/2013 |
| JP | H0653758 A | 2/1994 |
| JP | 2011228849 A | 11/2011 |

* cited by examiner

APPARATUSES AND METHODS FOR VOLTAGE BUFFERING

RELATED APPLICATIONS

This application is a 371 National Stage application claiming priority to International Application No. PCT/CN2014/085093, filed Aug. 25, 2014, which application is incorporated herein by reference in its entirety and for any purpose.

BACKGROUND

Memories and memory devices may include circuits that do not have current drive ability. Voltages from these circuits may be provided to other circuits in the memories or memory devices. In some applications, the voltages may be used as reference voltages. For example, a band gap circuit may provide a reference voltage to another circuit or a voltage monitoring device. The reference voltage may vary if it is provided to a circuit that draws a current from the band gap circuit. The performance of the circuit may degrade if the reference voltage varies. A voltage monitoring device may receive an inaccurate measurement if the reference voltage varies. It may be advantageous to prevent voltages provided by circuits without current drive ability from varying when the voltages are provided to other circuits or devices.

SUMMARY

An example apparatus according to the disclosure may include a current source that may be configured to provide a current, and a voltage buffer coupled to the current source to receive the current, wherein the voltage buffer may include a first stage that may be configured to receive an input voltage and provide an intermediate voltage, the first stage may be configured to receive the current from the current source; and a second stage may be configured to receive the intermediate voltage and provide an output voltage, the second stage may be configured to receive the current from the current source.

An example apparatus according to the disclosure may include a first load circuit, a second load circuit, a first transistor, wherein a drain of the first transistor is coupled to the first load circuit, a source of the first transistor is coupled to ground, and a gate of the first transistor may be configured to receive an input voltage, a second transistor, wherein a drain of the second transistor is coupled to the second load circuit, a source of the second transistor is coupled to ground, and a gate of the second transistor is coupled to the source of the first load circuit and the drain of the first transistor, and wherein the drain of the second transistor may be configured to provide an output voltage.

An example memory according the disclosure may include a pad, a test circuit coupled to the pad and may be configured to provide an output voltage at the pad to be monitored, the test circuit and may include a voltage buffer that may be configured to receive an input voltage and provide the output voltage, the voltage buffer may include: a first active load circuit, a second active load circuit, a first transistor, wherein a drain of the first transistor is coupled to the first load circuit, a source of the first transistor is coupled to ground, and a gate of the first transistor may be configured to receive an input voltage, and a second transistor, wherein a drain of the second transistor is coupled to the second load circuit, a source of the second transistor is coupled to ground, and a gate of the second transistor is coupled to the source of the first load circuit and the drain of the first transistor, wherein the first transistor, second transistor, and transistors of the first and second active load circuits may be matched, and a current source coupled to the voltage buffer and may be configured to provide a current to the voltage buffer.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure. As used herein, apparatus may refer to, for example, an integrated circuit, a memory device, a memory system, an electronic device or system, a smart phone, a tablet, a computer, a server, etc.

Figure 1:
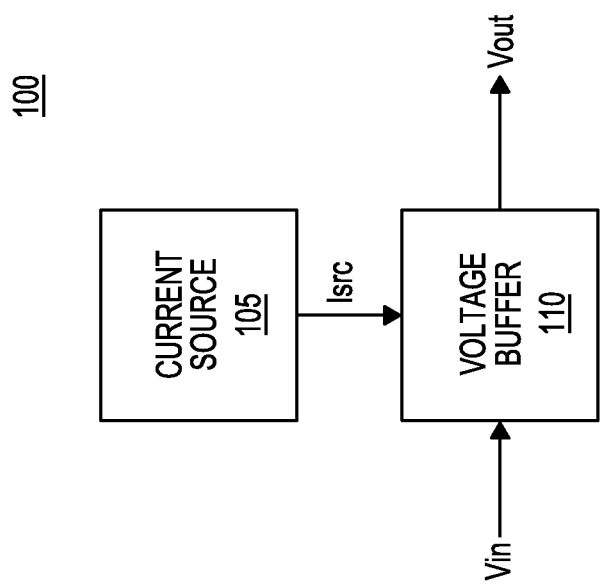
FIG. 1 is a block diagram of an apparatus according to an embodiment of the invention.

FIG. 1 is a block diagram of an apparatus 100 according to an embodiment of the invention. As used herein, apparatus may refer to, for example, an integrated circuit, a memory device, a memory system, an electronic device or system, a smart phone, a tablet, a computer, a server, etc. The apparatus includes a current source 105 coupled to a voltage buffer 110. The current source may prevent excessive current consumption by the voltage buffer circuit. The voltage buffer 110 may be configured to receive an input voltage Vin. The input voltage Vin may be provided by a circuit with relatively weak current drive ability (not shown in FIG. 1). The voltage buffer 110 may further be configured to receive a current Isrc from the current source 105. The voltage buffer 110 may provide an output voltage Vout, which may be equal to the input voltage Vin. The output voltage Vout may be provided for use by another circuit, for example, the output voltage Vout may be monitored by a testing circuit. The voltage buffer 110 may allow the input voltage Vin to be provided to other circuits in the form of output voltage Vout without current being drawn from the circuit from which the voltage buffer 110 received the input voltage Vin. As a result, there may be less variability in the observed value of Vout.

Figure 2:
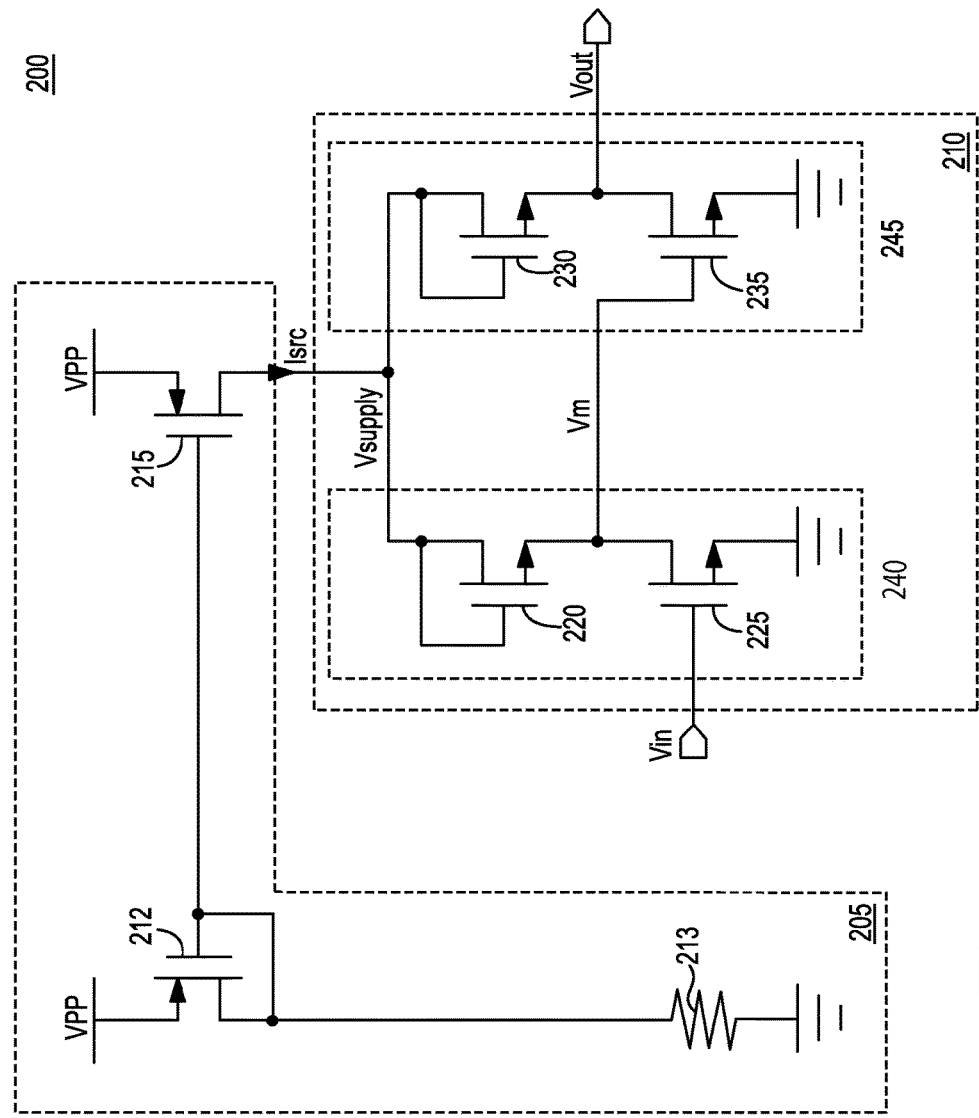
FIG. 2 is a circuit diagram of a voltage buffer according to an embodiment of the invention.

FIG. 2 is a diagram of a circuit 200 according to an embodiment of the invention. The circuit 200 includes a current source 205 and a voltage buffer 210. The current source 205 and the voltage buffer 210 may be used for the current source 105 and the voltage buffer 110 previously described with and shown in FIG. 1. The current source 205 may be a current mirror, although other current sources may be used. The current source may include transistors 212, 215. The gates of the transistors 212, 215 may be coupled to one another. The sources of transistors 212, 215 may be coupled to a voltage source Vpp. Transistor 212 may have both its drain and gate coupled to a resistance 213, which is in turn coupled to a voltage reference, for example, ground. The resistance 213 may limit the current of the current source 205. Transistors 212, 215 may be p-channel transistors, but other transistor types may be used. The resistance 213 may have a resistance value between 100 kΩ-1MΩ. Other values of resistance may also be used without departing from the scope of the disclosed invention. The drain of transistor 215 may be coupled to the voltage buffer 210 to provide a current Isrc.

The voltage buffer 210 may include two stages 240, 245. Transistors 220, 230 may have their gates and drains coupled to the current source 205. The transistors 220 and 230 may be configured as load circuits that provide respective electrical loads to the stage 240 and the stage 245. In some embodiments, the transistors 220 and 230 may be configured as active load circuits. The source of transistor 220 may be coupled to the drain of transistor 225 and the gate of transistor 235. Transistor 225 may receive input voltage Vin at its gate. The source of transistor 225 may be coupled to a reference voltage, for example, ground. Transistor 230 may have its source coupled to the drain of transistor 235. The gate of transistor 235 may be coupled to the source of transistor 220 and the drain of transistor 225. The source of transistor 235 may be coupled to a reference voltage. An output voltage Vout may be provided from the source of transistor 230 and the drain of transistor 235. Transistors 220, 225, 230, 235 may be n-channel transistors, but other transistor types may be used. In some embodiments, the transistors 220, 225, 230, 235 may be matched. For example, transistors 220, 225, 230, 235 may all have similar transistor dimensions and/or transistor characteristics. In some embodiments, the matched transistors 220, 225, 230, 235 may be identical, for example, the transistors 220, 225, 230, 235 may have identical transistor dimensions and/or identical transistor characteristics. Other transistor designs may also be used.

A voltage Vsupply may develop at the drains of transistors 220 and 230 as a result of the current Isrc provided by the current source 205. An intermediate voltage Vm may develop between stage 240 and stage 245 of the voltage buffer 210. The intermediate voltage Vm may be equal to the voltage Vsupply minus the input voltage Vin. The output voltage Vout may be equal to the voltage Vsupply minus the intermediate voltage Vm. Thus, the output voltage Vout may also equal the input voltage Vin. The stage 245 may have current drive ability and provide Vout, but the voltage buffer 210 prevents current being drawn from the source providing Vin at stage 240. This may allow for low mismatch and variation in the output voltage Vout. Circuits to which voltage Vout is provided may experience less variable performance because of the voltage buffer 210.

Figure 3:
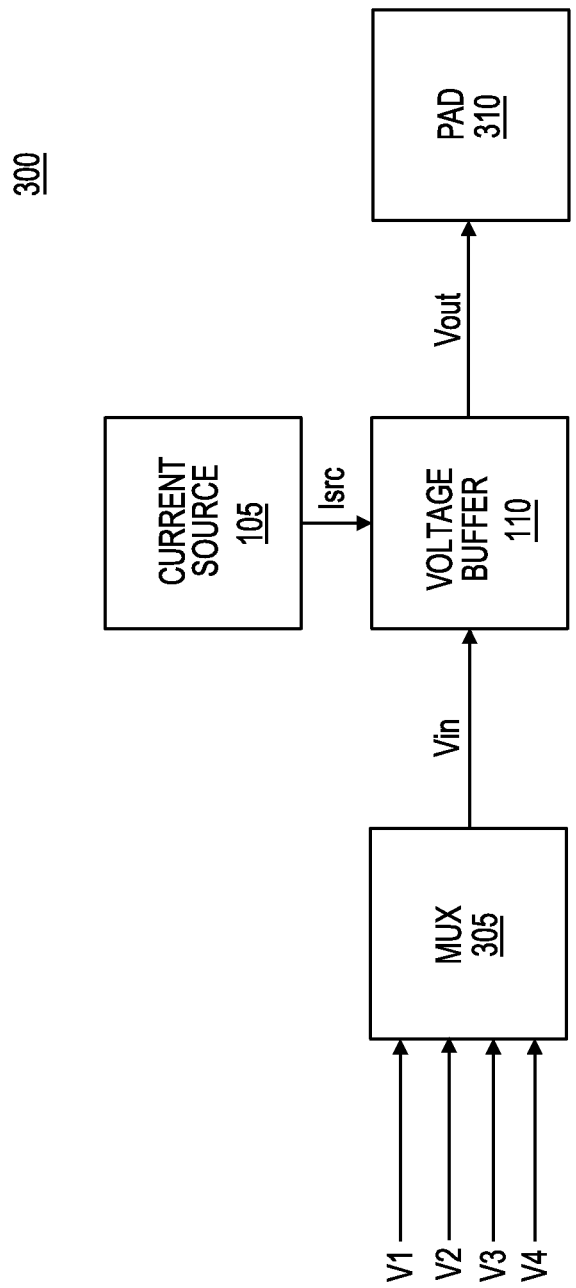
FIG. 3 is a block diagram of a test system according to an embodiment of the invention.

A block diagram of an apparatus including a test system 300 that may include an embodiment of the invention is illustrated in FIG. 3. The test system 300 may monitor multiple voltages V1-V4 from one or more circuits (not shown). A multiplexer (MUX) 305 may be used to select a voltage from the multiple voltages V1-V4 to be provided as an input voltage Vin to the voltage buffer circuit 110. The MUX 305 may allow multiple voltages to be monitored sequentially through a single voltage buffer 110. The voltage buffer circuit 110 may provide an output voltage Vout to a PAD 310 for monitoring by a monitoring device (not shown). The output voltage Vout may be equal to the input voltage Vin. Accordingly, the monitoring device may monitor the value of the input voltage Vin by monitoring the output voltage Vout. The monitoring device may measure less variation in Vout compared to existing monitoring circuits because no current is being drawn by the voltage probe or other monitoring device from the source providing Vin.

Figure 4:
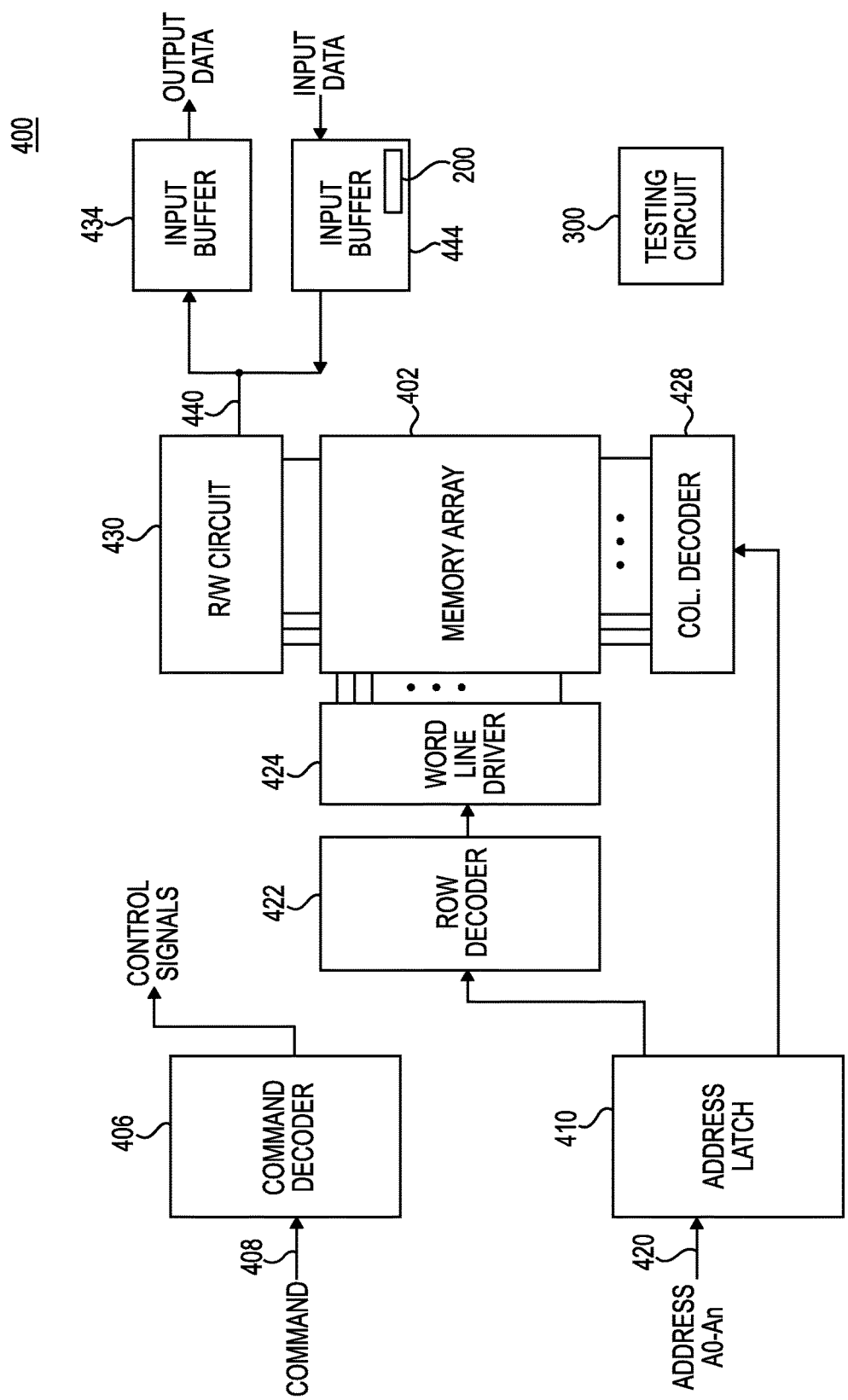
FIG. 4 is a block diagram of a portion of a memory according to an embodiment of the invention.

FIG. 4 illustrates a portion of a memory 400 according to an embodiment of the present invention. The memory 400 includes an array 402 of memory cells, which may be, for example, volatile memory cells (e.g., DRAM memory cells, SRAM memory cells, etc.), non-volatile memory cells (e.g., flash memory cells, PCM cells, etc.), or some other types of memory cells.

The memory 400 includes a command decoder 406 that receives memory commands through a command bus 408 and generates corresponding control signals within the memory 400 to carry out various memory operations. The command decoder 406 responds to memory commands applied to the command bus 408 to perform various operations on the memory array 402. For example, the command decoder 406 is used to generate internal control signals to read data from and write data to the memory array 402. Row and column address signals are applied to the memory 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output buffer 434 via an input-output data bus 440. Write data are applied to the memory array 402 through a data input buffer 444 and the memory array read/write circuitry 430.

Circuits according to an embodiment of the invention may be included in the memory 400. For example, the circuit 200 (FIG. 2) may be included in the data input buffer 444, which may include a bias voltage generator. The circuit 200 may be configured to operate as a voltage monitor circuit used during testing of the memory device to confirm proper generation of the bias voltage by the bias voltage generator within the data input buffer 444. In some embodiments, test circuit 300 may be included in the memory 400, which may include multiple input buffers similar to input buffer 444. The MUX 305 may allow for the bias voltage of multiple input buffers to be monitored with the test circuit 300. Testing may be performed during manufacture of the memory or at a later time.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
   a first load circuit;
   a second load circuit;
   a first transistor, wherein a drain of the first transistor is coupled to the first load circuit, a source of the first transistor is coupled to ground, and a gate of the first transistor is configured to receive an input voltage;
   a second transistor, wherein a drain of the second transistor is coupled to the second load circuit, a source of the second transistor is coupled to ground, and a gate of the second transistor is coupled to the source of the first load circuit and the drain of the first transistor; and
   wherein the drain of the second transistor is configured to provide an output voltage.

2. The apparatus of claim 1, wherein the first load circuit, second load circuit, first transistor, and second transistor are n-channel transistors.

3. The apparatus of claim 2, wherein the n-channel transistors have identical transistor characteristics.

4. The apparatus of claim 1, wherein the first load circuit comprises an n-channel transistor having a gate coupled to a drain and wherein the second load circuit comprises an n-channel transistor having a gate coupled to a drain.

5. The apparatus of claim 1, wherein the first load circuit and the second load circuit are configured to receive a current.

6. The apparatus of claim 1, further comprising a current mirror configured to provide a current to the first and second load circuits.

7. The apparatus of claim 6, wherein the current mirror comprises two p-channel transistors.

8. The apparatus of claim 6, wherein the current mirror comprises a resistance coupled to a first p-channel transistor and a reference voltage.

9. A memory, comprising:
   a pad;
   a test circuit coupled to the pad and configured to provide an output voltage at the pad to be monitored, the test circuit including:
      a voltage buffer configured to receive an input voltage and provide the output voltage, the voltage buffer including:
         a first active load circuit;
         a second active load circuit;
         a first transistor, wherein a drain of the first transistor is coupled to the first load circuit, a source of the first transistor is coupled to ground, and a gate of the first transistor is configured to receive an input voltage; and
         a second transistor, wherein a drain of the second transistor is coupled to the second load circuit, a source of the second transistor is coupled to ground, and a gate of the second transistor is coupled to the source of the first load circuit and the drain of the first transistor, wherein the first transistor, second transistor, and transistors of the first and second active load circuits are matched; and
      a current source coupled to the voltage buffer and configured to provide a current to the voltage buffer.

10. The memory of claim 9, wherein the current source comprises:
    first and second p-channel transistors having gates coupled together; and
    a resistance coupled to the first p-channel transistor.

11. The memory of claim 9, wherein the test circuit further includes a multiplexer configured to receive a plurality of voltages, wherein the multiplexer is further configured to provide one of the plurality of voltages to the voltage buffer as the input voltage.

12. The memory of claim 9, wherein the first and second load circuits of the voltage buffer are coupled to the current source.

13. The memory of claim 12, wherein the first transistor, second transistor, and transistors of the first and second active load circuits comprise matched n-channel transistors.

* * * * *